(12) United States Patent
Yaklin et al.

(10) Patent No.: US 6,249,171 B1
(45) Date of Patent: Jun. 19, 2001

(54) METHOD AND APPARATUS FOR GALVANICALLY ISOLATING TWO INTEGRATED CIRCUITS FROM EACH OTHER

(75) Inventors: Daniel A. Yaklin, Garland; Kevin Lee Kornher, Dallas, both of TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/503,598

(22) Filed: Feb. 11, 2000

Related U.S. Application Data

(62) Division of application No. 08/835,888, filed on Apr. 8, 1997.
(60) Provisional application No. 60/015,063, filed on Apr. 8, 1996.

(51) Int. Cl.⁷ .................................................. H03K 17/16
(52) U.S. Cl. ............................................. 327/382; 326/30
(58) Field of Search .................................. 327/110, 168, 327/177, 304, 382, 565; 326/82, 30, 62, 86, 56; 375/258

(56) References Cited

U.S. PATENT DOCUMENTS

| | | | |
|---|---|---|---|
| 3,889,072 | 6/1975 | Stewart | 179/170 |
| 4,901,215 * | 2/1990 | Martin-Lopez | 363/21 |
| 4,906,871 | 3/1990 | Iida | 307/475 |
| 5,311,083 | 5/1994 | Wanlass | 307/475 |
| 5,384,808 | 1/1995 | Van Brunt et al. | 375/36 |
| 5,604,450 | 2/1997 | Borkar et al. | 326/82 |
| 5,627,839 | 5/1997 | Whetsel | 371/22.3 |
| 5,793,754 * | 8/1998 | Houldsworth et al. | 370/276 |
| 5,952,849 * | 9/1999 | Haigh | 326/82 |

FOREIGN PATENT DOCUMENTS

| | | |
|---|---|---|
| 0 801468 | 4/1997 | (EP) . |
| 58-156225 | 9/1983 | (JP) . |
| 60-064547 | 4/1985 | (JP) . |
| 61-005657 | 1/1986 | (JP) . |
| 2-260438 | 10/1990 | (JP) . |
| 6-074788 | 3/1994 | (JP) . |
| 7-022867 | 1/1995 | (JP) . |

* cited by examiner

Primary Examiner—My-Trang Nuton
(74) Attorney, Agent, or Firm—Wade James Brady, III; Frederick J. Telecky, Jr.

(57) ABSTRACT

An isolation circuit (10) and method for providing dc isolation between two integrated circuit devices (11) and (12) that may be referenced to different ground potentials is presented. The isolation circuit (10) includes, in each circuit, an output buffer (20, 20') connected to deliver a signal to an input/output pin (16, 17) of the circuit (11, 12) with which the output buffer is associated. A capacitance (30), which may be a single capacitor or a combination of capacitors, is connected to the pins (16, 17) of each of the circuits (11, 12), and in each circuit (11, 12), an input buffer (22, 22') is connected to receive a signal delivered onto the I/O pin (16, 17). The input buffer (22, 22') includes a circuit for resisting a charge leakage from the capacitor, which, preferably is a bus holder circuit (36), or the like. In another embodiment, a transformer (85) is used to provide dc isolation between the two integrated circuits (62, 64).

7 Claims, 1 Drawing Sheet

METHOD AND APPARATUS FOR GALVANICALLY ISOLATING TWO INTEGRATED CIRCUITS FROM EACH OTHER

This is a Divisional Application of Ser. No. 08/835,888, filed Apr. 8, 1997.

BACKGROUND OF THE INVENTION

1. Field of the Invention

This invention relates to improvements in integrated circuit isolation techniques and apparatus, and more particularly to improvements in apparatuses and methods for galvanically isolating two circuits, such as integrated circuits, or the like, from each other.

2. Relevant Background

In many circuit constructions, it is often necessary to provide dc isolation between two or more integrated circuits. For example, not uncommonly, the ground potential of one integrated circuit may be at a different dc level than a ground potential of another integrated circuit to which it may be connected. When such ground potential isolation is needed, typical ground isolating schemes have been employed. One such scheme, for example, is that described by IEEE 1394-1995, Annex J.

In the past, however, when isolated ground design circuits such as those specified by IEEE 1394-1995 have been required, the current isolation scheme between the physical layer device and the link layer device suggested in the IEEE standard is costly in terms of external components required, board space, supply current, and silicon area. It also does not have good noise margin or propagation delay.

More particularly, one of the problems with the prior art techniques of providing isolation between two integrated circuit devices is the large number of required components needed to effect the dc isolation between pins. For example, the IEEE 1394-1995 standard requires, in its capacitor embodiment, two relatively large-sized capacitors and seven resistors off-device as well as specific differentiating, tristating, and hysteresis input buffer circuitry on-device. Thus, it can be seen that when the required isolation circuitry is employed over a number of interconnections for every pin on each integrated circuit that is interconnected, a large number of such isolation circuits will be required. Moreover, depending upon the voltages that are to be handled by the capacitors, for example, about 50 volts, or less, relatively large size capacitors are needed consuming even more space on the board through which the interconnect is accomplished. Furthermore, it will be appreciated, of course, that accompanying the large number of components required to accomplish the integrated circuit interface and isolation, is a concomitant increase in the cost of the final product.

The IEEE 1394-1995 standard additionally has an isolation circuit embodiment that is implemented with a transformer. The transformer isolation circuit embodiment also requires a large number of components, but can be constructed to withstand higher dc voltages than the capacitor embodiment, for example, about 500 volts, or less. Again, the transformer embodiment requires a significant amount of interconnect physical area in which to construct the isolation circuit and, when multiplied by the number of pins that are interconnected, a significant amount of circuit components and layout area is consumed.

In typical operation of a circuit that is interconnected using isolation circuitry of the type generally used in accordance with the IEEE 1394-1995 standard to enable bi-directional signals to be delivered to and supplied from the integrated circuit, a differentiating output buffer circuit and a digital input buffer having signal hysteresis are provided. The output buffer and input buffer are generally connected to the same input/output pin, to achieve bi-directional signal transfer. The output buffer circuit is generally clocked by clock pulse sources onboard the integrated circuit device on which the output buffer is constructed.

Differentiation circuits of the type provided as a part of the input buffer circuit are difficult and complex to construct in an integrated circuit structure and, additionally, require considerable "real estate" on the integrated circuit device. When the number of input/output pins is increased, an increased amount of "real estate" on the integrated circuit device is required to provide the multiplied number of differentiating circuits for each input buffer's section.

Moreover, as mentioned, the differentiation input buffer circuit typically has an amplifier having hysteresis. The hysteresis requires a received signal transitioning from low to high exceed a particular level, for instance, above ½ $V_{DD}$, and which, on the other hand, requires a signal transitioning from high to low to be less than ½ $V_{DD}$ to turn off the detector circuit.

Thus, in normal operation, if an input signal applied to the circuit is of general magnitude of about ½ $V_{DD}$, if the input circuit is constructed of a typical CMOS inverter, commonly both of the transistors of the inverter may be biased to conduct. This results in a relatively large current drawn through the device. When the current draw is multiplied across all the input/output pins of the integrated circuit device, it can be appreciated that a relatively large current is required in the quiescent state of the integrated circuit device. This can be disadvantageous in many applications, such as video cameras/camcorders, lap top computers, and the like, which are battery operated, and which require minimal use of the battery capacity for extended operation.

Typically in the operation of the isolation circuit between two integrated circuits in delivering a signal from one integrated circuit device to another, if, for example, an output pulse is to be delivered extending beyond a single clock pulse, a high state is clocked from the output buffer of one integrated circuit at the a clock pulse output. Thereafter, the output of the output buffer is tristated, or switched to a high impedance state. The signal is detected by the input buffer circuit of the other integrated circuit, which switches to a high state. By virtue of the hysteresis effect of the input buffer circuit, the input buffer continues to report that a high state is being received, until the input signal drops below the threshold value, below ½ $V_{DD}$, for example, as explained above.

Another of the problems that has been experienced with isolation circuits in the past is that typically isolation circuits have a limited noise immunity. In particular, isolation circuits do not generally permit a large margin of noise immunity because of the design requirement for an amount of hysteresis in the input buffer circuit. As a result, for example, if an input voltage is ½ $V_{DD}$ at an input pin, the difference is very small between the input potential and the threshold potential that must be exceeded for the circuit to change states. (The input would typically be at ½ $V_{DD}$ since the output of the transmitter or output buffer portion of the integrated circuit to which the circuit is connected is typically in a tristate impedance.) Consequently, if a noise spike or pulse is induced onto the input line, the magnitude of the pulse necessary to reach the switching threshold of the input buffer circuit is relatively small. A typical isolation circuit, for example, may provide noise immunity of only about 0.2 volts to about 0.8 volts, depending upon the particular variables of the circuit.

Another consideration in the design of the device interface circuits constructed according to the IEEE 1394-1995 standard, is that of the propagation delay through the interface circuit. Typically, in the past, the propagation delay that is experienced is about two to three nanoseconds. In many applications, this propagation delay at least may need to be considered, and at worst, may disqualify the circuit for the particular application considered.

What is needed, therefore, is a method and apparatus for providing a circuit and method for isolating dc or galvanic voltage between two or more circuits, such as integrated circuits, or the like.

SUMMARY OF THE INVENTION

Considering the above, therefore, it is an object of the invention to provide an improved isolation circuit and method for providing dc or galvanic voltage isolation between two or more circuits, such as integrated circuits, or the like.

It is yet another object of the invention to provide an interfacing circuit and method of the type described that requires fewer external components than the number of components required by the IEEE 1394-1995 standard circuit implementation.

It is another object of the invention to provide an integrated circuit interfacing circuit and method of the type described that does not require critical differentiating circuits in the on-device input buffer section.

It is another object of the invention to provide an improved circuit and method of the type described that has better noise immunity than interfacing circuits constructed according to the IEEE 1394-1995 standard.

These and other objects, features, and advantages will become apparent from the following detailed description of the invention, when read in conjunction with the accompanying drawings and appended claims.

Thus, according to a broad aspect of the invention, an isolation circuit for providing dc isolation between two circuits that may be referenced to different ground potentials is presented. The circuits to be isolated may be, for example, circuits on integrated circuit devices, or the like. The isolation circuit includes, an output buffer connected to deliver a signal to an output node of the circuit with which the output buffer is associated. An input buffer is connected to receive a signal delivered onto an input node. A capacitance, which may be a single capacitor or a combination of capacitors, is connected between the output and input nodes of each of the circuits. The input buffer includes a circuit for resisting a charge leakage from the capacitance, which, preferably is a bus holder circuit, or the like. If the circuits are provided on integrated circuit devices, the busholder may be provided either internally or externally to the integrated circuit devices. In another embodiment of the invention, a signal encoder may be associated with the output buffer and a signal decoder may be associated with the input buffer to counteract or resist the effects of charge leakage from the capacitance, without the need for a bus holder or other charge holding circuit.

According to another broad aspect of the invention, an isolation circuit for providing dc isolation between first and second circuits is provided. The first and second circuits may be contained on integrated circuit devices, or the like. The circuits may, but need not be, referenced to different ground potentials. The isolation circuit includes a transformer having first and second transformer coils. The first coil of the transformer is connected to a ground of the first circuit, and the second coil of the transformer is connected to a ground of the second circuit. A first capacitance, which may be single or multiple capacitors, may be connected between a signal output node of the first circuit and a second side of the first coil of the transformer. A second capacitance, which also may be single or multiple capacitors, may be connected between a signal input node of the second circuit and a second side of the second coil of the transformer. A signal output buffer is provided in the first circuit, and is connected to the output node. A signal input buffer is provided in the second circuit, connected to the respective input node, the signal input buffers being constructed to hold a desired state at the input node despite charge leakage from the capacitance. The signal input buffers may include, for example, bus holder circuits.

According to yet another broad aspect of the invention, a method is provided for providing dc isolation between a first circuit from a second circuit, which may be contained in separate integrated circuit devices in which a ground potential of the first circuit may be different from a ground potential of the second circuit. The method includes connecting a capacitance between respective signal input and output nodes of the first and the second circuits. The capacitance may be provided on a single or multiple capacitor devices. A signal output buffer is contained in one of the circuits, being connected to an output node of the circuit on which it is contained, and a signal input buffer is contained in the other of the circuits, being connected to the input node of the circuit in which it is contained. The signal input buffers is constructed to hold a desired state at the input node despite charge leakage from the capacitance.

The step of providing a signal input buffer may be performed by providing a first inverter having an input connected to the input node and an output connected to the circuit, and providing a bus holder at the input to the inverter to hold a current state of the inverter despite charge leakage from the capacitor. The step of providing a bus holder may performed by providing a second inverter across the first inverter in an opposite direction from the first inverter. The second inverter would typically have less output drive than the output buffer that is driving the input node.

According to yet another broad aspect of the invention, a method is presented for providing dc isolation between a first circuit and a second circuit. The circuits may be part of first and second integrated circuit devices, in which a ground potential of the first circuit may be different from a ground potential of the second circuit. The method includes connecting one side of a first coil of a transformer to a ground of the first circuit and one side of a second coil of the transformer to a ground of the second circuit. A first capacitance is connected between a signal output node of the first circuit and a second side of the first coil of the transformer. A second capacitance is connected between a signal input node of the second circuit and a second side of the second coil of the transformer. A signal output buffer is provided in the first circuit, connected to said output node. A signal input buffer is provided in the second circuit, connected to the input node. The signal input buffer is constructed to hold a desired state at an input of the circuit despite charge leakage from the capacitance.

The step of providing a signal input buffer may be performed by providing a first inverter having an input connected to the input node and an output connected to the circuit, and providing a bus holder at the input to the inverter to hold a current state of the inverter despite charge leakage from the capacitance. The bus holder may be provided by providing a second inverter across the first inverter in an opposite direction from the first inverter.

The circuit and method of the invention results in the advantages that no differentiation logic is required to differentiate the driven signal. This reduces silicon device area. Moreover, only one external capacitor is required per lead for capacitive isolation, as opposed to a minimum of two external capacitors and seven external resistors used in a circuit complying with the capacitor embodiment of the IEEE 1394-1995 standard. For transformer isolation only two external capacitors and one external transformer are required, as opposed to two external capacitors, one external transformer, and a minimum of seven external resistors used in a circuit complying with the transformer embodiment of the IEEE 1394-1995 standard. This reduces components, board space and cost.

In addition, inputs swing rail-to-rail as opposed to ½ $V_{DD}$. This increases noise margin. The inputs remain at the rails as opposed to normally sitting at ½ $V_{DD}$. In the prior art when the inputs remained at ½ $V_{DD}$, the quiescent current draw could be very high, and careful design was required to ensure supply current did not exceed design limitations. In addition, the delay through the isolation barrier is much lower than in the prior art. This reduces the timing constraints on both the physical layer and the link layer devices. The input circuit design constraints are much looser as opposed to critical threshold and hysteresis constraints in the prior art.

Still further, the circuit and method of the invention use less supply current on both the physical layer and link layer device, and uses no supply current in the external components, in contrast to previous techniques and circuits.

BRIEF DESCRIPTION OF THE DRAWINGS

The aforementioned and other features and objects of the present invention and the manner of attaining them will become more apparent, and the invention itself will be best understood, by reference to the following description of a preferred embodiment taken in conjunction with the accompanying drawings, wherein.

In the various figures of the drawings, like reference numerals are used to denote like or similar parts.

DETAILED DESCRIPTION OF THE PREFERRED EMBODIMENTS

It should be noted that the process steps and structures herein described do not necessarily form a complete process flow for manufacturing integrated circuits. It is anticipated that the present invention may be practiced in conjunction with integrated circuit fabrication techniques currently used in the art, and only so much of the commonly practiced process steps are included as are necessary for an understanding of the present invention.

The solution advanced by the present invention is to use a latching input and standard CMOS output connected through a capacitor, which acts as the isolation barrier. The CMOS output on one side of the isolation barrier pulls the corresponding input on the other side of the isolation barrier high or low, since the charge on the capacitor cannot change instantaneously. At this point, the latching input holds the charge on the capacitor, until the output changes in the other direction.

As will become apparent, the input in the circuit of the invention swings rail-to-rail, as opposed to the prior art which had maximum swings of ½ $V_{DD}$, and no differentiation of the transmitted signal is required. The inputs are held at the rails, in contrast to the prior art, in which the inputs were held at ½ $V_{DD}$.

The circuit and technique of the invention require only a single external capacitor for capacitive isolation, in contrast to the prior art, in which a minimum of two external capacitors and five external resistors were required. In the case of transformer isolation the invention requires only two external capacitors and one external transformer, in contrast to the prior art, which required a minimum of two external capacitors, one external transformer and five external resistors.

Figure 1:
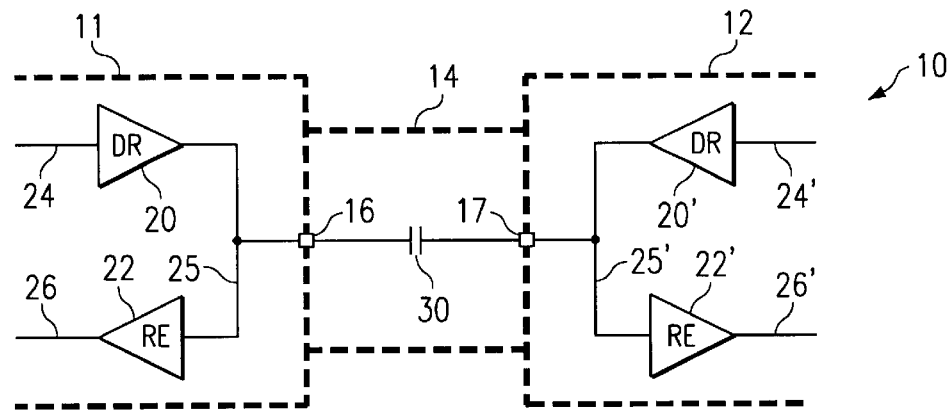
FIG. 1 is an electrical schematic diagram of an isolation circuit used to isolate two integrated circuit devices, according to the preferred embodiment of the invention.

Thus, a circuit 10 for isolating two integrated circuit devices 11 and 12 according to a preferred embodiment of the invention is shown in FIG. 1. Although the invention is described herein in the context of an embodiment of interfacing and isolating to integrated circuit devices, it will be appreciated that the invention can be used in isolating two nodes that may be referenced to different dc levels or ground potentials that are different from each other. The circuit 10 is used to isolate a first integrated circuit device 11 from a second integrated circuit device 12, which may be at different ground potentials. The integrated circuit devices 11 and 12 may be mounted to a printed circuit board 14, or other structure. The integrated circuit devices 11 and 12 have respective connection nodes 16 and 17, which are shown respectively as connection pins. Although only one connection pin is shown for each of the integrated circuit devices 11 and 12, it will be understood that multiple pins may be interconnected between the two devices.

Each of the devices 11 and 12 as associated with its respective input/output node 16 and 17 a respective output buffer circuit 20 and input buffer circuit 22. The output buffer and input buffer circuit of the integrated circuit device 20 is similarly constructed, the output buffer and input buffer reference numerals being designated with a prime ('), specifically, output buffer 20' and input buffer 22'.

Thus, signals that are provided from circuitry (not shown) on integrated circuit device 11 are provided on a line 24 to the output buffer 20, the output of which is connected to input/output pin 16. Similarly, signals that are received onto the device 11 at the input/output pin or node 16 are connected to the input of the input buffer 22 for delivery on line 26 to circuitry (not shown) on the integrated circuit 11. In a similar fashion, the signals that are provided from circuitry (not shown) on integrated circuit 12 are delivered on line 24' for delivery to the input/output node 17 and, signals that are provided as an input on input/output node 17 to the integrated circuit device 12 are provided to the input of the input buffer 22' for delivery on line 26' to the circuitry (not shown) of the integrated circuit device 12.

As shown, a capacitor 30 is provided interconnecting the input/output nodes 16 and 17 of the respective integrated circuit devices 11 and 12. It should be noted that although the invention is illustrated using a single capacitor, multiple capacitors can be used to provide the single capacity provided between the two interconnected nodes of the integrated circuits under consideration. This may be of advantage, for instance, to achieve a higher voltage that may be withstood by the capacitor element. For example, it may be cheaper to provide two-50 volt capacitors in series to achieve a 100 volt withstand ability, rather than to provide a 100 volt single capacitor. Consequently, although the capacitor element is referred to as a "single capacitor" herein, it will be understood that that term is used to indicate a single capacity that does not require the other voltage dividers and resistor interconnections of the type typically provided in an IEEE 1394-1995-type integrated circuit interconnection for isolation.

In the construction of the isolation circuit, according to the invention, the output buffer circuit 20 may be constructed in manner similar to that of the previous output buffer circuits of the prior art. More specifically, no special construction modifications need to be made to the output buffer circuit employed in the isolation circuit of the invention.

Figure 2:
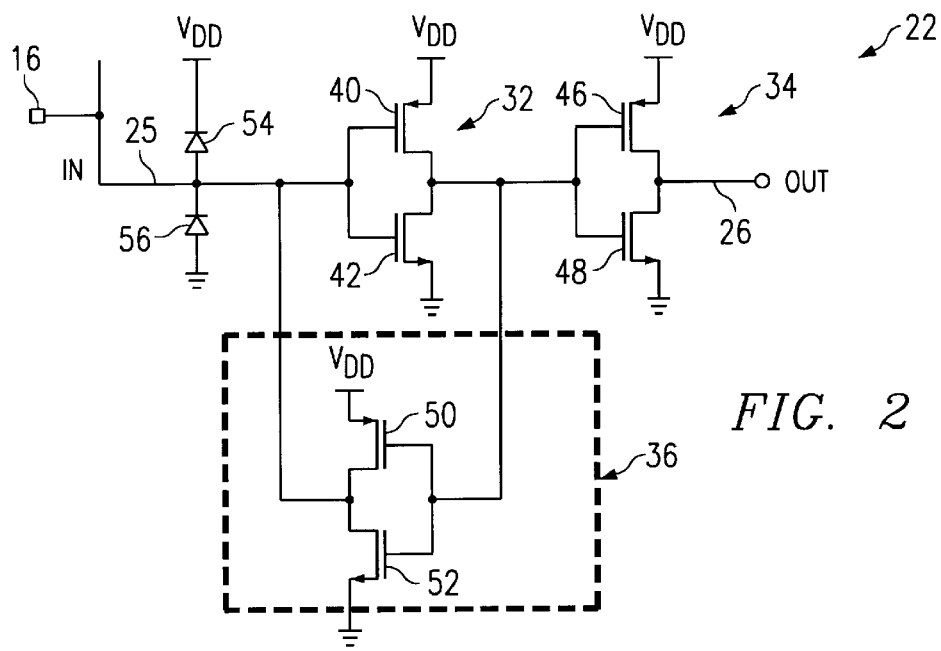
FIG. 2 is an electrical schematic diagram of an input buffer circuit constructed according to a preferred embodiment of the invention.

On the other hand, the construction of the input buffer circuitry 22 may be as shown in FIG. 2. As shown, the input buffer 22 has three sections, inverter sections 32 and 34 and a bus holder section 36. The inverters 32 and 34 in the embodiment shown each include an n channel and a p channel MOS transistor connected between $V_{DD}$ and ground. Thus, the inverter 32 is connected with a p channel MOS transistor 40 and an n channel MOS transistor 42, with the input signal on line 25 connected to their respective gates, with their respective drains connected to the input of the following inverter 34, and with their respective sources connected to $V_{DD}$ and ground as shown. Similarly, the inverter 34 includes a p channel MOS transistor 46 and an n channel transistor 48 connected with their respective gates receiving the input signal, the drains connected to the output line 26 and their respective sources connected to $V_{DD}$ and ground.

The bus holder 36 is connected between the input and output of the inverter 32. The bus holder 36, in the embodiment shown, is an inverter circuit with a P channel MOS transistor 50 and an N channel MOS transistor 52. The gates of the transistors 50 and 52 are connected to the output from the inverter 32. The drains, on the other hand, of the transistors 50 and 52 are connected to the input of the inverter 32 on line 25. The sources of the transistors 50 and 52 are connected respectively to $V_{DD}$ and ground. It should be understood that other circuits may be constructed to provide the bus holder function, as well.

Thus, in the operation, as the input on line 25 rises from a low to a high state, the state of the inverter 32 remains high until the threshold of the transistor 42 is exceeded, at which time, the transistor 42 conducts, causing the output of the inverter 32 to go low. Concurrently, the p channel transistor 40 is turned off. When the output from the inverter 32 goes low, the transistor 50 of the bus holder circuit 36 conducts, and the transistor 52 is switched to a non-conducting state. On the other hand, when the signal on the input line 25 falls to a low state, transistor 40 is caused to conduct, while transistor 42 is caused to switch to a non-conducting state. This raises the output from the inverter 32 to a high state, which is applied to the gates of the transistors 50 and 52 of the bus holder 36. This causes the transistor 50 to switch to a non-conducting state and the transistor 52 to conduct. Thus, the output from the bus holder 36 that is applied to the line 25 is maintained in a low signal state. The output of the bus holder circuit 36, delivered on to line 25, therefore, changes to maintain the input/output signal conditions of the inverter 32.

To ensure that the circuit 22 synchronizes at start up on a power-up to a correct state, upon the first state change, diode elements 54 and 56 are provided, respectively connected, between the input line 25 and $V_{DD}$ and the input line 25 and ground. The diodes 54 and 56 furthermore synchronize the output buffer and the input to the circuit to keep the inverter 32 from being driven above or below ground depending upon the initial start-up state of the output buffer 20 and associated input buffer 22'.

Thus, for example, if the inverter 32 on power-up assumes a high input state and a transition from low to high on pin 16 is received, the excess voltage will be conducted to ground by diode 56 to protect the inverter circuit 32 and also insure that it synchronizes to a correct input state. Similarly, if the input to the inverter 32 is low and an initial transition from high to low is received on pin 16, the diode 54 will conduct to assure that the transistors of the inverter 32 are not driven below ground, and to insure that the input to the inverter 32 is synchronized to its correct state. Thus, the diodes 54 and 56 serve to clamp the input line 25 to a voltage range between one diode drop above and below $V_{DD}$ and ground.

It will be appreciated that by virtue of the operation of the bus holder circuit 36, the inverter 32 will remain in the state to which it is switched until a sufficiently large signal is received on line 25 to overcome the switching or transition conduction states of the transistors 50 and 52 of the bus holder circuit 36. It can, therefore, be readily appreciated that the circuit 22 has a considerably higher noise immunity than the prior art isolation circuits constructed according to IEEE standard 1394-1995.

It should be noted that one of the primary functions of the bus holder circuit 36 is to ensure that capacitor leakages do not affect the operation of the input buffer circuit. There are many sources of such charge leakage from the capacitor, including leakages induced by the various transistors of the circuit, and within the capacitor itself. Thus, it will be appreciated that the circuit 22 shown in FIG. 2 serves to eliminate a possibility of charge leakages that may be experienced by the capacitor 30 affecting the state of the inverters of the input buffer circuit 22. Thus, because of the operation of the bus holder 36, the state of the inverter 32 is maintained until it is deliberately switched, without regard to minor voltage variations on the input line 25 that may be due, for example, to charge leakage from the capacitor 30.

Resisting or minimizing the effects of capacitor leakages may be accomplished in other ways as well. For example, the use of an encoded output buffer signal with a decoder in the receive section may also be employed so that switching takes place within a sufficiently small period so that leakage will not have time to drain enough charge from the capacitor to change the state of the input. An encoded signal, for example, may be a pulse code modulated signal that changes state every period at a predefined frequency, or other suitable signal.

Since the input buffer circuit 22 has a relatively high impedance input, circuit 22 contributes very little to the charge changes that may appear on the capacitor 30. The capacitor 30, therefore, is principally limited to the quality of the capacitor itself and the internal leakages that may exist within the capacitor. The bus holder circuit 36, therefore, ensures that the charge on the capacitor is not allowed to decrease due to leakages through the threshold of the inverter 32, thereby, increasing the overall reliability of the circuit to maintain the states that to which it is deliberately switched. The bus holder 36, consequently, maintains the current to hold the pin 16 at the desired state.

It can also be readily appreciated that the need for a hysteresis circuit of the type required by the isolation circuits constructed according to the IEEE 1394-1995 standard is not required for proper operation of the input buffer circuit 22 of the invention. Moreover, using the circuit 22 as shown with the bus holder 36 maintaining the state of the signal applied to the inverter 32, only a single capacity element is required to effect the dc isolation between the input/output nodes 16 and 17 of another integrated circuit device to be isolated from each other.

It will be appreciated, furthermore, that the need for the complex differentiation circuits of the prior art has been eliminated and, as is evident, the number of circuit components required to provide the dc isolation function has been greatly reduced from those required by the circuits and methods according to the IEEE 1394-1995 standard.

Furthermore, it should be noted that the noise margins are significantly increased through the use of the bus holder circuit 36 since the bus holder dampens noise spikes significantly, and to achieve a switching, the current that is applied to the bus holder must be sufficiently large as to overcome the current state of the bus holder.

It should be appreciated that although the isolation circuit of the invention is primarily intended for use in those applications in which the dc or galvanic voltages of the two integrated circuits that are interconnected are different, in those applications in which the dc voltage or ground levels are essentially the same, the circuit can be used in a direct connection between the two integrated circuits. Moreover, although a differential circuit is no longer needed because of the operation of the bus holder circuit employed according to the invention, a differential circuit will, nevertheless, work if it is selected to be used.

Figure 3:
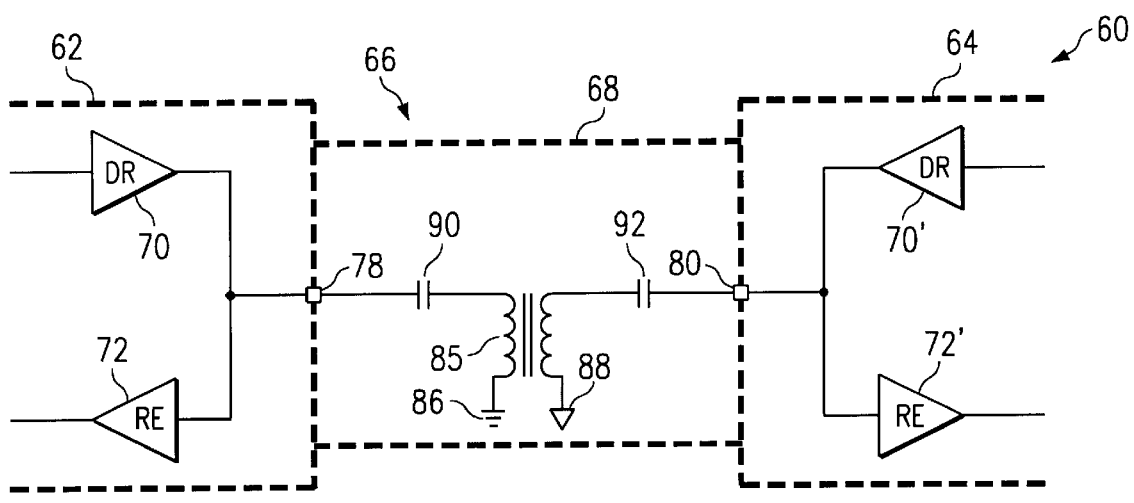
FIG. 3 is an electrical schematic diagram of an isolation circuit, according to the preferred embodiment of the invention, for isolating two integrated circuit devices using a transformer isolation circuit.

If desired, as shown in FIG. 3, a transformer isolation circuit 60 may be constructed according to the invention. As shown, two integrated circuit devices 62 and 64 are interconnected by an isolating circuit 66 that may be constructed on a printed circuit board 68 or other suitable structure. The integrated circuit devices 62 and 64 each has respective output buffer circuit 70 and 70' and input buffer circuit 72 and 72'. The output buffer circuit 70 and 70' and input buffer circuit 72 and 72' may be similarly constructed. The output from the output buffer circuit 70 and input to the input buffer circuit 72 of the integrated circuit device 62 are provided on input/output pin 78. In a similar fashion, the output from the output buffer circuit 70' and input to the input buffer circuit 72' of the integrated circuit device 64 are provided on the input/output to pin 80. The input buffer circuit 72 and 72' may be constructed in a manner similar to that described above with reference to FIG. 2 using a bus holder circuit or other similar technique to ensure that leakage currents do not affect the operation of the inverter circuits employed as a part thereof.

In the circuit embodiment 60 shown in FIG. 3, a transformer 85 may be provided with one side referenced to the ground 86 that is used in conjunction with the integrated circuit device 62 and with the other side connected to a ground 88 that is associated with the integrated circuit device 64. Respective capacitors 90 and 92 are connected to the respective sides of the transformer 85 connecting them respectively to input nodes or pins 78 and 80. It should be noted that by properly encoding the output signal from the output buffer to ensure that the transformer 85 does not saturate, the capacitors 90 and 29 may not be necessary in some applications. Because of the isolation capability of the transformers that may be used, the transformer embodiment 60 shown in FIG. 3 may be used principally when higher dc voltage differences are anticipated between the two integrated circuit devices 60 and 64. It should be pointed out also that an encoding scheme may be required in the transformer implementation to ensure that normal transitions are within a sufficiently small period to assure that the transformer does not saturate.

Although the invention has been described and illustrated with a certain degree of particularity, it is understood that the present disclosure has been made only by way of example, and that numerous changes in the combination and arrangement of parts can be resorted to by those skilled in the art without departing from the spirit and scope of the invention, as hereinafter claimed.

What is claimed is:

1. An isolation circuit for providing dc isolation between first and second circuits that may be referenced to different ground potentials, comprising:

a transformer having first and second transformer coils;

said first coil of said transformer being connected to a ground of said first circuit and to an output node of said first circuit, and said second coil of said transformer to a ground of said second circuit and an input node of said second circuit;

a first capacitance connected between said output node of said first circuit and a second side of said first coil of said transformer, and a second capacitance connected between said input node of said second circuit and a second side of said second coil of said transformer;

a signal output buffer in said first circuit connected to said output node;

a signal input buffer in said second circuit, said signal input buffer being connected to said input node and being constructed to hold a desired state at said input node despite charge leakage from said capacitances;

wherein said signal input buffer comprises a first inverter and a bus holder comprising a second inverter connected in a reverse direction across the first inverter.

2. The circuit of claim 1 wherein each of said first and second capacitances is a single capacitor.

3. The circuit of claim 1 wherein said first and second circuits to be isolated are on first and second integrated circuit devices.

4. The integrated circuit of claim 1 wherein said bus holder circuit is internal to said integrated circuit containing said input buffer.

5. The integrated circuit of claim 1 wherein said bus holder provides less drive than said output buffer.

6. The integrated circuit of claim 1 wherein said bus holder comprises a p-channel MOS device and an n-channel MOS device connected between a supply voltage and a ground potential, said MOS devices having gates connected to an output of said first inverter and drains connected to an input of said first inverter.

7. The integrated circuit of claim 1 wherein said output node is an input/output node, and further comprising a second input buffer contained in said first circuit having an input connected to said input/output node, said second input buffer being constructed to hold a desired sate at said input/output node despite charge leakage from said capacitances.

* * * * *